United States Patent [19]
Takada

[11] Patent Number: 4,630,013

[45] Date of Patent: Dec. 16, 1986

[54] CURRENT CONTROLLED VARIABLE INDUCTOR

[75] Inventor: Noboru Takada, Sakado, Japan

[73] Assignee: Toko Kabushiki Kaisha, Tokyo, Japan

[21] Appl. No.: 694,058

[22] Filed: Jan. 23, 1985

[30] Foreign Application Priority Data

| | | | |
|---|---|---|---|
| Jan. 30, 1984 | [JP] | Japan | 59-14822 |
| Apr. 28, 1984 | [JP] | Japan | 59-64129[U] |
| Apr. 28, 1984 | [JP] | Japan | 59-64130[U] |
| Nov. 21, 1984 | [JP] | Japan | 59-176987[U] |
| Nov. 22, 1984 | [JP] | Japan | 59-177626[U] |

[51] Int. Cl.⁴ .......................... H03J 3/20; H01F 21/08

[52] U.S. Cl. .......................................... 334/12; 336/83; 336/155

[58] Field of Search .......................... 334/4, 11, 12, 14; 336/83, 155, 160, 165

[56] References Cited

U.S. PATENT DOCUMENTS

| | | | |
|---|---|---|---|
| 2,608,610 | 8/1952 | Thulin | 336/83 X |
| 2,997,584 | 8/1961 | Querfurth | 334/12 |
| 3,601,734 | 8/1971 | Chesney | 336/83 |

*Primary Examiner*—Paul Gensler

*Attorney, Agent, or Firm*—Stevens, Davis, Miller & Mosher

[57] ABSTRACT

An inductor is configured so as to wind a control coil on one of winding portions of first and second cores and to wind a tuning coil on the other winding portion to insert the second core into a hollow portion provided inside the first core, thereafter accommodating the first and second cores thus assembled into a pot-shaped core, wherein both winding portions of the first and second cores are arranged in parallel with each other and the winding portion of the first core is arranged perpendicular to a bottom surface of the pot-shaped third core. The control coil and the tuning coil are arranged so that their magnetic paths overlap with each other at the winding portion of the second core, thereby to control a current flowing through the control coil when energized to vary effective permeability of the core on which the tuning coil is wound, thus producing changes in inductance.

14 Claims, 20 Drawing Figures

CURRENT CONTROLLED VARIABLE INDUCTOR

BACKGROUND OF THE INVENTION

The present invention relates to a current controlled variable inductor used in an electronic tuning circuit, e.g. a tuner assembled in an automotive vehicle.

FIG. 1 is a side view illustrating a prior art variable inductor of this kind configured so that a U-shaped core 1 of magnetic material and an I-shaped core 2 of magnetic material are combined with each other, and a control coil 3 and a tuning coil 4 are wound on the core 1. The tuning coil 4 is wound through grooves 5 provided at the end portion of the core 1. By flowing a dc current or a low frequency current through the control coil 3, a closed magnetic path is formed in the cores 1 and 2 as indicated by a dotted line 6 to change the magnetic flux density based on a control of the current flowing therethrough thereby to control the effective permeability of the portion of the core 1 on which the tuning coil 4 is wound to vary its inductance. A magnetic path formed when the tuning coil 4 is energized is indicated by a dotted line 7. The grooves 5 are provided for principally adjusting the magnetic flux density of the control coil 3 across the tuning coil 4 from a structural point of view.

However, with such a structure configured so that each of the magnetic paths formed by the control coil 3 and the tuning coil 4 is formed as a complete closed magnetic path, the characteristics of the tuning coil 4, e.g. inductance and temperature characteristic, etc., are likely to vary depending upon how the cores 1 and 2 are in contact with each other. Namely, the mirror finished surface condition or slight variations in dimension in each portion 8 at which the cores 1 and 2 are in contact with each other affects various characteristics. Since the cores 1 and 2 are fixed by means of a bond in most cases, there is the possibility that the bond intrudes into the contact portion 8, resulting in a change in the contact condition. Further, since it is impossible to directly wind the control coil 3 or the tuning coil 4 on the core 1, it is required to fit coils which have been separately wound over the core 1. In addition, a process for bonding the cores 1 and 2 is required.

As stated above, the variable inductor of the conventional structure has strict requirement for accuracy needed when cores are assembled, particularly accuracy of contact portions. Thus, it is difficult to reduce variations in characteristics and the assembly work is troublesome.

SUMMARY OF THE INVENTION

An object of the present invention is to eliminate drawbacks with the prior art variable inductor, thus providing a variable inductor which is advantageous in practical use.

A current controlled variable inductor according to the present invention is characterized in that there is a hollow portion in a winding portion of a first core, in that a second core is inserted into the hollow portion so that a winding portion of the second core is in parallel with the winding portion of the first core, in that the first core is inserted into a pot-shaped third core so that the winding portion of the first core is perpendicular to a bottom surface of the third core, and in that a magnetic path produced by a control coil wound on one of the first and second cores and a magnetic path formed by a tuning coil wound on the other thereof overlap with each other at the winding portion of the second core.

DETAILED DESCRIPTION OF THE INVENTION

Figure 2:
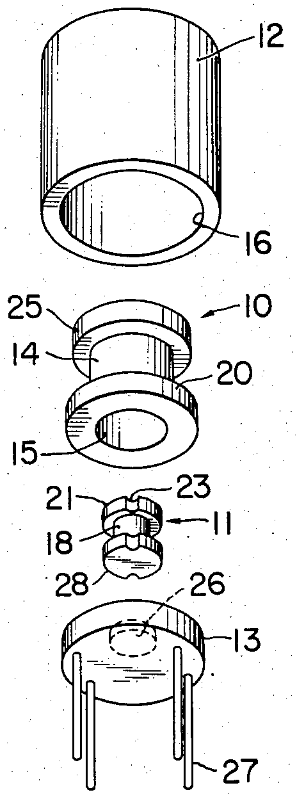
FIG. 2 is an exploded perspective view illustrating an embodiment of a current controlled variable inductor according to the present invention.

A preferred embodiment of a current controlled inductor according to the present invention will be described with reference to FIGS. 2 and 3. FIG. 2 is an exploded perspective view showing only core portions, and FIG. 3 is an explanatory view in longitudinal cross section cut in the center when the core portions shown in FIG. 2 are assembled.

Figure 3:
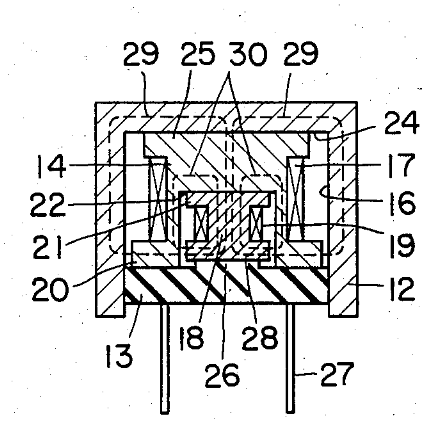
FIG. 3 is an explanatory view cut in longitudinal cross section when the current controlled variable inductor shown in FIG. 2 is assembled.

As shown in FIGS. 2 and 3, the current controlled inductor of this embodiment comprises drum-shaped first and second cores 10 and 11, a pot-shaped third core 12, and a base member 13, wherein the first, second and third cores 10, 11 and 12 are made of magnetic material of ferrite, and the base member 13 is made of synthetic resin.

The first core 10 is provided at both the axial ends with circular flanges 25 and 20, respectively, and a winding portion 14 having therein a hollow portion 15 which is circular in its lateral cross section and is opened at the lower flange 20. A control coil 17 is wound on the winding portion 14.

The second core 11 is provided at both the axial ends with circular flanges 21 and 28, and a winding portion 18 on which a tuning coil 19 is wound. The second core 11 is inserted into the hollow portion 15 of the first core 10 so that the winding portion 18 is in parallel with the winding portion 14 thereof. The upper flange 21 of the second core 11 is arranged so as to be in contact with a bottom surface 22 of the hollow portion 15. The second core 11 is further provided with grooves 23 for leading a lead wire of the tuning coil 19. The first core 10 is inserted into the third core 12 in a manner that the winding portion 14 is perpendicular to a bottom surface 24 of the third core 12 and the upper flange 25 is in contact with the bottom surface 24. The disk-shaped base member 13 is provided on the upper central surface with a projection 26 and on the lower surface with a plurality of terminal pins 27 for connecting lead wires of the control coil 17 and the tuning coil 19. The second core 11 is fixed on the projection 26 and the first core 10 is fixed around the projection 26. The outer peripheral surface of the base member 13 is fixed to the inner peripheral surface 16 of the third core 12. The projection 26 serves to facilitate positioning of the first and second cores 10 and 11 on the base member 13. There are small clearances between the outer peripheral surface of the lower flange 20 of the first core 10 and the inner peripheral surface of the third core 12, and between the outer peripheral surface of the lower flange 28 of the second core 11 and the inner peripheral surface of the hollow portion 15 of the first core 10, respectively. A contact portion of the outer surface of the upper flange 21 of the second core 11 and the bottom surface 22 of the hollow portion 15 of the first core 10, and a contact portion of the upper surface of the upper flange 25 of the first core 10 and the bottom surface 24 of the third core 12 may be in contact with each other through an adhesive e.g. a Mylar film for preventing breakage due to vibration.

The variable inductor thus configured according to the present invention is such that a magnetic path produced by the control coil 17 principally extends, as indicated by a dotted line 29, via the winding portion 14 of the first core 10, the third core 12, the lower flange 20 of the first core 10, the lower flange 28 of the second core 11, and the winding portion 18 of the second core 11. On the other hand, a magnetic path produced by the tuning coil 19 principally extends, as indicated by a dotted line 30, via the winding portion 18 of the second core 11, the winding portion 14 of the first core 10, the lower flange 20 of the first core 10 and the lower flange 28 of the second core 11. The magnetic path 29 produced by the control coil 17 and the magnetic path 30 produced by the tuning coil 19 overlap with each other to a maximum degree at the winding portion 18 of the second core 11. By changing the magnetic flux density with the control coil 17, it is possible to control the effective permeability of the second core 11 to vary the inductance of the tuning coil 19.

FIGS. 4 to 7 are longitudinal cross sectional views illustrating different embodiments of a variable inductor according to the present invention, respectively.

Figure 4:
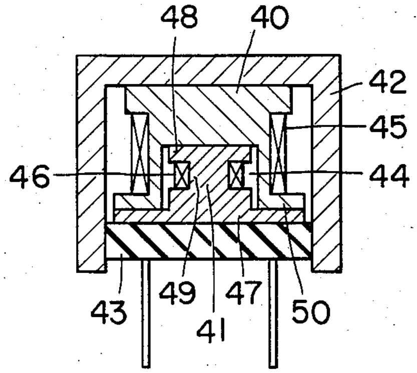
FIGS. 4 to 10 are longitudinal cross sectional views illustrating further different embodiments of the invention, respectively.

A variable inductor shown in FIG. 4 comprises a first core 40, a second core 41, a third core 42, a base member 43, and a hollow portion 44, wherein a control coil 45 and a tuning coil 46 are wound on the first core 40 having a hollow portion 44 and the second core 41, respectively. The embodiment in FIG. 4 differs from the embodiment shown in FIGS. 2 and 3 in that the second core 41 is provided with a lower flange 47 formed as double steps, wherein a winding portion 49 is formed between its upper step and an upper flange 48 and its lower step is in contact with a lower flange 50 of the first core 40. The embodiment in FIG. 4 is such that the lower flange 50 of the first core 40 and the lower flange 47 of the second core 41 are in contact with each other. As a result, a magnetic path produced by the tuning coil 46 becomes close to a substantially closed magnetic path as compared to that shown in FIGS. 2 and 3. Accordingly, the embodiment shown in FIG. 4 makes it possible to reduce an influence of changes in magnetic flux density caused by the control coil 45 within the winding portion 49 to finely adjust inductance of the tuning coil 46.

Figure 5:
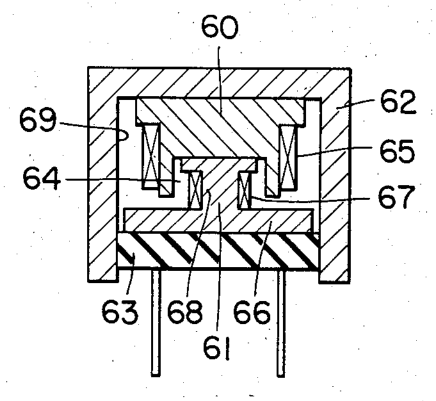

The embodiment of a variable inductor shown in FIG. 5 comprises a first core 60 having a hollow portion 64, a second core 61, a third core 62, a base member 63 and a hollow portion 64, wherein a control coil 65 is wound on the first core 60 without provision of a lower flange and a tuning coil 67 is wound on the second core 61 having a lower flange 66 larger than its upper flange. There are clearances between the first core 60 and the lower flange 66 of the second core 66, and between the outer peripheral side surface of the lower flange 66 and an inner peripheral side surface 69 of the third core 62, respectively. A magnetic path produced by the control coil 65 extends directly to the winding portion 68 through the lower flange 66 of the second core 61 because the first core 60 is not provided with the lower flange. Thus, this enables to control inductance of the tuning coil 67 under great influence of changes in magnetic flux density caused by the control coil 65.

Figure 6:
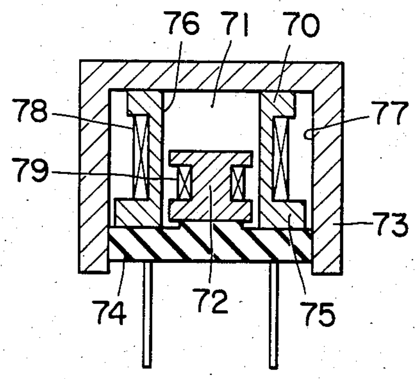

The embodiment shown in FIG. 6 comprises a first core 70 through which a hollow portion 71 is penetrated, a second core 72, a third core 73 and a base member 74. There are clearances between the second core 72 and an inner side surface 76 of the hollow portion 71, and between a lower flange 75 of the first core 70 and an inner side surface 77 of the third core 73, respectively. Because of provision of the penetrated hollow portion 71, magnetic paths produced by the control coil 78 and the tuning coil 79 become both close to a substantially opened magnetic path. This embodiment is particularly suitable when a variable inductor is used at a high frequency.

Figure 7:
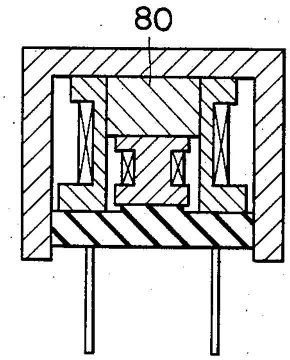

The embodiment shown in FIG. 7 is characterized in that the hollow portion 71 shown in FIG. 6 is clogged by a core 80 of material different from that of the first core 70.

As stated above, the current controlled variable inductor according to the present invention is configured so that the second core on which the tuning coil is wound is arranged inside of the inductor, the first core on which the control coil is wound and the pot-shaped third core are arranged outside of the second core, and these cores are fixed to the base member. In fabricating such a variable inductor, a method therefor may comprise the steps of winding a tuning coil on a second core fixed to a base member, thereafter winding a control coil on a first core outwardly positioned, and finally fitting a third core thereover. It is needless to say that an alternate arrangement of the tuning coil and the control is possible.

Then, other embodiments configured so that a control coil and a tuning coil are arranged inwardly and outwardly, respectively will be described with reference to FIGS. 8 to 10.

Figure 8:
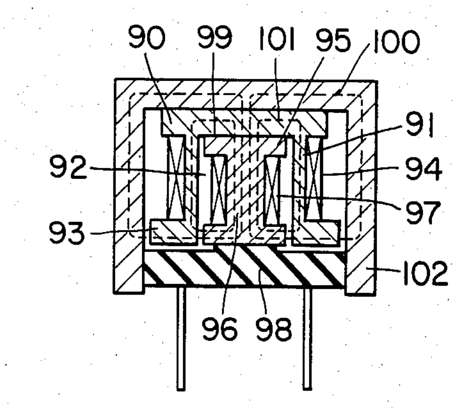

The embodiment shown in FIG. 8 comprises a first core 90 provided with circular flanges at both axial ends and a winding portion 91 having a hollow portion 92 which is circular in lateral cross section and opened at the lower flange 93. A tuning coil 94 is wound on the winding portion 91. A control coil 97 is wound on a winding portion 96 of a second core 95 provided with circular flanges at both axial ends. The second core 95 is inserted into the hollow portion 92 so that the winding portion 96 is in parallel with the winding portion 91 of the first core 90. The second core 95 is in contact with a bottom surface 99 of the hollow portion 92 with the first core 90 being slightly raised from a base member 98, thus holding the contact in a stabilized manner.

The variable inductor thus configured of this embodiment is also characterized in that a magnetic path 100 produced by the tuning coil 94 and a magnetic path 101 produced by the control coil 97 overlap with each other to a maximum degree at the winding portion 96 of the second core 95 within the winding portion 91 of the first core 90. By changing magnetic flux density of the winding portion 96 with the control coil 97, it is possible to vary inductance of the tuning coil 94. Reference numeral 102 denotes a third core.

Figure 9:
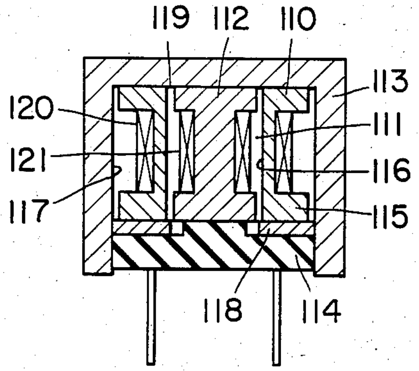

The embodiment shown in cross section of FIG. 9 comprises a first core 110 through which a hollow portion 111 is penetrated, a second core 112, a third core 113, and a base member 114. A tuning coil 120 and a control coil 121 are wound on the first core 110 and the second core 112, respectively. There are clearances between the second core 112 and an inner side surface 116 of the hollow portion 111, and between a lower flange 115 of the first core 110 and an inner side surface 117 of the third core 113, respectively. The first core 110 is resiliently mounted on the base member 114 by means of a resilient material 118. This ensures that the contact of both the cores 110 and 112 with respect to a bottom surface 119 of the third core 113 is not varied even if there is a slight discrepancy between the height of the first core 110 and that of the second core 112. The variable inductor of this embodiment is configured so that the second core 112 is fitted into the whole hollow portion 111 penetrating the first core 110, thereby enabling to vary inductance of a tuning coil 120 in response to a slight change in magnetic flux density caused by a control coil 121.

Figure 10:
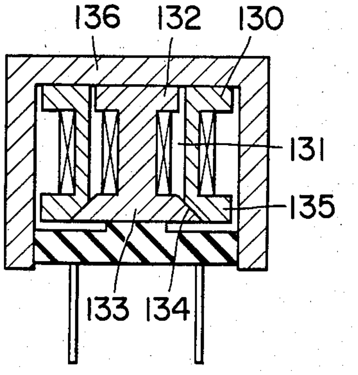

The embodiment shown in cross section of FIG. 10 comprises a first core 130 provided with a hollow portion 131 penetrating therethrough and a lower flange 135 having a tapered portion inside thereof, a second core 132 provided with a lower flange 133 having a tapered portion 134, and a third core 136 wherein the tapered portion 134 of the second core 132 and that of the first core 130 are engaged with each other. This is advantageous in positioning of both cores 130 and 132 because the relative arrangement of both cores can be determined based on the above engagement relationship.

The embodiments where the tuning coil is positioned outside the control coil as shown in FIGS. 8 to 10 can reduce the turns of the tuning coil as compared to the embodiments where the tuning coil is positioned inside the control coil. As a result, distributed capacity between windings of the tuning coil becomes small, thereby enabling to reduce changes in inductance due to temperature changes.

Figure 12:
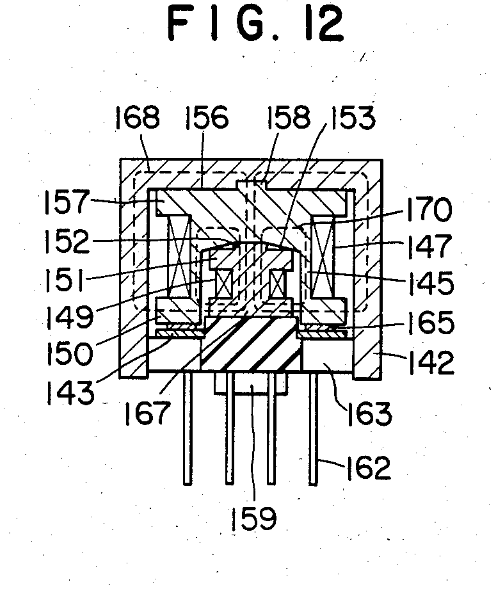
FIG. 12 is an explanatory view cut in longitudinal cross section when the variable inductor shown in FIG. 11 is assembled.
Figure 11:
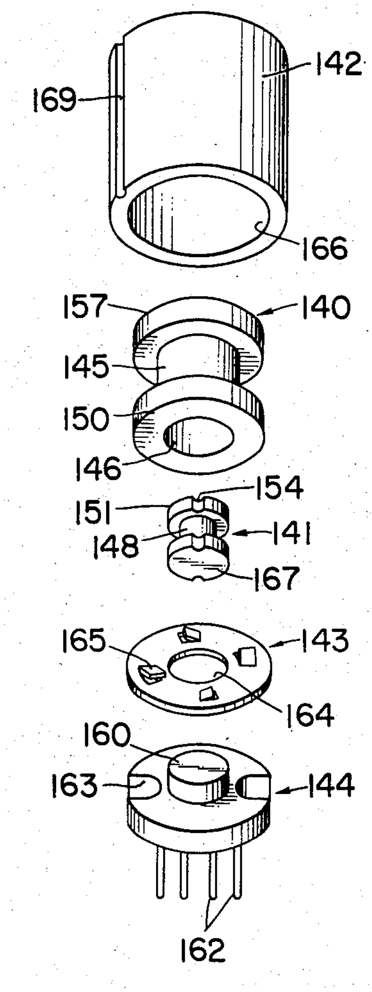
FIG. 11 is an exploded perspective view illustrating a still further embodiment of the invention.
Figure 13:
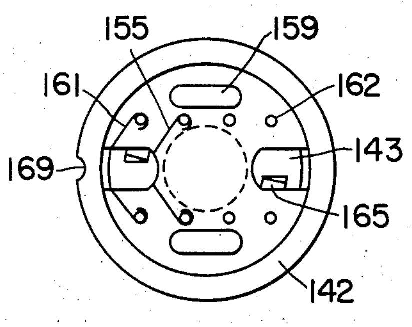
FIG. 13 is a botoom view of FIG. 12.

Referring to FIGS. 11 to 13, there are shown still further embodiment of a variable inductor according to the present invention.

FIG. 11 is an exploded perspective view wherein an indication of windings is omitted. FIG. 12 is an explanatory view shown in longitudinal cross section and FIG. 13 is a bottom view. The variable inductor shown in FIGS. 11 to 13 comprises drum-shaped first and second cores 140 and 141, a pot-shaped third core 142, a spring member 143, and a base member 144, wherein the first, second, and third cores 140, 141 and 142 are all made of magnetic material of ferrite and the base member 144 is made of synthetic resin.

The first core 140 is provided at both axial ends with circular flanges and a winding portion 145 provided with a hollow portion 146 which is circular in lateral cross section and opened at the lower flange 150. A control coil 147 is wound on the winding portion 145.

The second core 141 is provided at both axial ends with circular flanges and a winding portion 148 on which a tuning coil 149 is wound. The second core 141 is inserted into the hollow portion 146 of the first core 140 so that the winding portion 148 is in parallel with the winding portion 145 of the first core 140. The upper flange 151 is formed with a projection 152 which is in contact with a bottom surface 153 of the hollow portion 146. It is difficult to make flat a narrow bottom surface 153 of the hollow portion 146. However, because of the presence of the projection 152, this structure can prevent that the peripheral edge of the upper flange 151 bumps against the bottom surface 153, resulting in breakage thereof. The second core 141 is provided at the upper flange 51 with grooves 154 for leading a lead wire 155 for the tuning coil 149.

The first core 140 is inserted into a third core 142 in a manner that the winding portion 145 is perpendicular to the bottom surface 156 of the third core 142 and the upper flange 157 is in contact with the bottom surface 156. The upper flange 157 is provided with a projection 158 which is fitted into a recess of the bottom surface 156, thus facilitating positioning of the first core 140 in a horizontal direction. The third core 142 is configured so that a magnetic path 168 produced by the control coil 147 is formed therewithin, thus serving to prevent divergence of magnetic flux. The third core 142 is further provided with grooves 169 for providing directivity on the outer peripheral surface thereof. The disk-shaped base member 144 is provided with a disk-shaped projection 160 on its upper central surface. The base member 144 is further provided on its lower surface with a plurality of terminal pins 162 for connecting a lead wire 161 for the control coil 147 and a lead wire 155 for the tuning coil 149. The base member 144 is further provided with grooves 163 for passing the lead wires 155 and 161 therethrough and projections 159 for preventing the stem portion of each terminal pin 162 from being in contact with a printed board (not shown) when the base member 144 is mounted on the printed board.

The spring member 143 is formed with a thin circular plate of e.g. phosphor bronze. The thin circular plate constituting the spring member 143 is provided with a circular bore 164 in the center thereof and a plurality of contact pieces 165 projected upwardly formed by partially punching the surrounding portion defining the bore 164. The spring member 143 is fixed onto the base member 144 with the bore 164 being engaged with the projection 160 and the contact pieces 165 being disposed in the upper direction.

The first core 140 is mounted on the contact pieces 165 and the second core 141 fixed onto the projection 160. The second core 141 is configured so that the lower flange 167 has an outer radius slightly smaller than that of the projection 160. Thus, there is no possibility that the outer periphery of the lower flange 167 is in contact with the inner periphery of the surrounding portion defining the hollow portion 146. The outer peripheral surface of the base member 144 is fixed to the inner peripheral surface 166 of the third core 142. The spring member 143 serves to prevent changes in contact of the bottom surface 153 of the hollow portion 146 and the upper flange 151 of the second core 141 which changes may be produced due to variations in the depth of the hollow portion 146 and the height of the second core 141.

There are small clearances between the lower flange 150 of the first core 140 and the inner peripheral surface 166 of the third core 142, and between the lower flange 167 of the second core 141 and the inner peripheral surface of the hollow portion 146 of the first core 140, respectively. Instead of the spring member 143, a silicon rubber or an adhesive or a bond having high viscosity may be used for the same purpose. Further, with the second core 141 being mounted on a resilient material e.g. a spring member, the first core 140 may be fixed onto the base member 144. Reference numerals 168 and 170 denote magnetic paths produced by the control coil 147 and the tuning coil 149, respectively.

Figure 15:
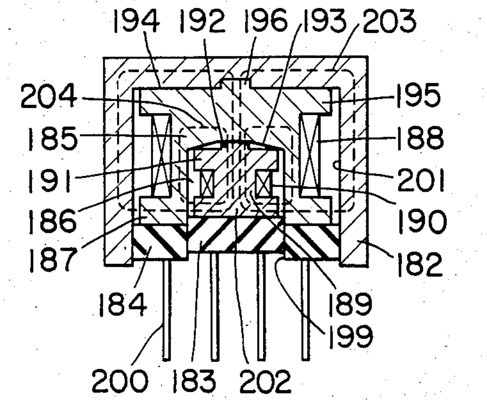
FIG. 15 is an explanatory view cut in longitudinal cross section when the variable inductor shown in FIG. 14 is assembled.
Figure 14:
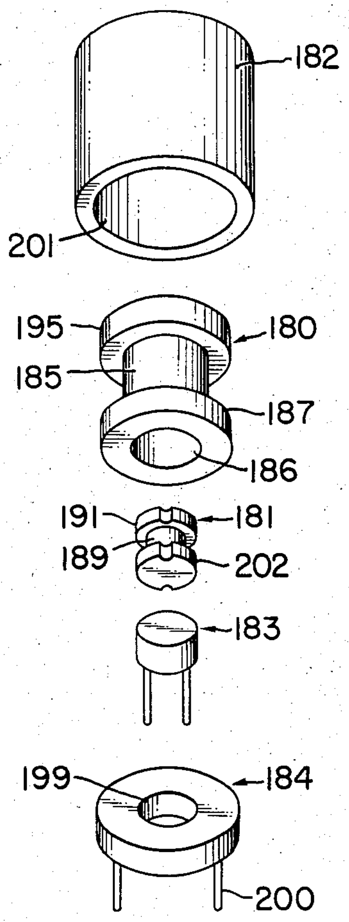
FIG. 14 is an exploded view illustrating a still more further embodiment of the invention.
Figure 16:
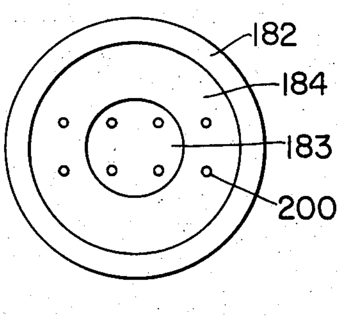
FIG. 16 is a bottom view of FIG. 15.

Referring to FIGS. 14 to 16, there is shown a still more further embodiment of a variable inductor according to the present invention.

FIG. 14 shows an exploded perspective view in which an indication of windings is omitted, FIG. 15 is an explanatory view shown in longitudinal cross section, and FIG. 16 is a bottom view.

As shown in FIGS. 14 to 16, the variable inductor of this embodiment comprises drum-shaped first and second cores 180 and 181, a pot-shaped third core 182, and base members 183 and 184 of synthetic resin, wherein the first, second and third cores 180, 181 and 182 are all formed of magnetic material of ferrite. The first core 180 is provided at both axial ends with circular flanges and a winding portion 185 provided with a hollow portion 186 which is circular in lateral cross section and opened at the lower flange 187. A control coil 188 is wound onto the winding portion 185.

The second core 181 is provided at both axial ends with circular flanges and a winding portion on which a tuning coil 190 is wound. The second core 181 is inserted into the hollow portion 186 so that the winding portion 189 is in parallel with the winding portion 185 of the first core 180. The upper flange 191 is formed with a projection 192 in the center thereof and the projection 192 is in contact with a bottom surface 193 of the hollow portion 186.

The first core 180 is inserted into the third core 182 so that the winding portion 185 is perpendicular to a bottom surface 194 of the third core 182 and the upper flange 195 is in contact with the bottom surface 194. A projection 196 formed on the upper flange 195 is fitted into a recess formed in the bottom surface 194, thereby facilitating the positioning of the first core 180 in a horizontal direction. The third core 182 is configured in a manner that a magnetic path 203 produced by the control coil 188 is formed therewithin, thus serving to prevent the divergence of the magnetic flux.

The disk-shaped base member 184 is provided with a circular bore 199 in the central thereof and a plurality of terminal pins 200 for connecting lead wires for the control coil 188 and the tuning coil 190. The first core 180 is supported on the base member 184. The base member 183 on which the second core 181 is mounted is fitted into the bore 199 of the base member 184. The outer peripheral surface of the base member 184 is fixed to the inner peripheral surface 201 of the third core 182. The outer peripheral surface of the base member 183 is also fixed to the inner peripheral surface of the annular portion defining the bore 199.

The above-mentioned embodiment is characterized in that the base member 184 for supporting the first core 180 and the base member 183 for supporting the second core 181 are provided separately with each other. This can prevent that the contact of the bottom surface 193 of the hollow portion 186 and the upper flange 191 of the second core 181 is changed due to the variations in the depth of the hollow portion 186 and the height of the second core 181. There are small clearances between the outer peripheral surface of the lower flange 187 of the first core 180 and the inner peripheral surface 201 of the third core 182, and between the outer peripheral surface of the lower flange 202 of the second core 181 and the inner peripheral surface of the hollow portion 186 of the first core 180, respectively.

Figure 17:
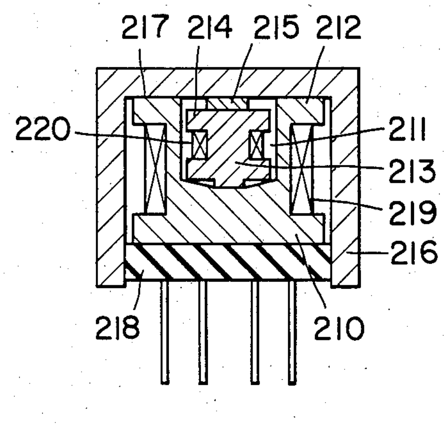
FIG. 17 is a longitudinal cross sectional view illustrating a different embodiment related to the embodiment shown in FIGS. 14 to 16.

FIG. 17 is a longitudinal cross section showing an embodiment that first and second cores separately supported with each other.

A variable inductor of this embodiment comprises a first core 210 having a control coil 219 wound thereon and a hollow portion 211 opened at an upper flange 212, a second core 213, having a tuning coil 220 wound thereon, which is fitted into the hollow portion 211, and a third core 216 fitted over the first core 210, wherein one flange 214 of the second core 213 is supported by a bottom surface 217 of the third core 216 through a silicon rubber member 215 while the other thereof is supported by a bottom surface of the hollow portion 211. The first core 210 is supported on the base member 218 in such a manner that the upper flange 212 is in contact with the bottom surface 217 of the third core 216. It is only required for the silicon rubber member 215 to function to resiliently press the second core 213 onto the curved surface of the hollow portion of the first core 210. Accordingly, a metal washer etc. may be used instead. This structure of this embodiment can prevent that the contact of the bottom surface of the hollow portion 211 and the second core 213 changes due to the variations in the depth of the hollow portion 211 and the height of the second core 213.

Figure 19:
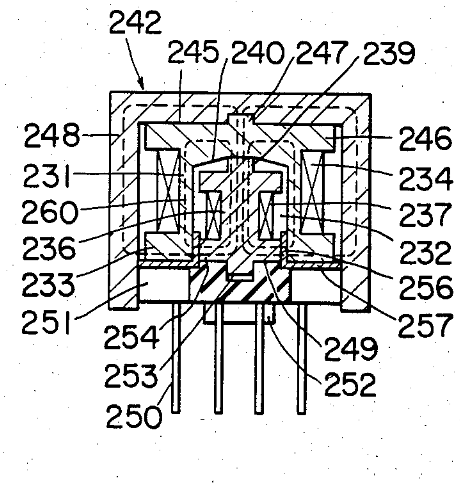
FIG. 19 is an explanatory view cut in longitudinal cross section when the variable inductor shown in FIG. 18 is assembled.
Figure 18:
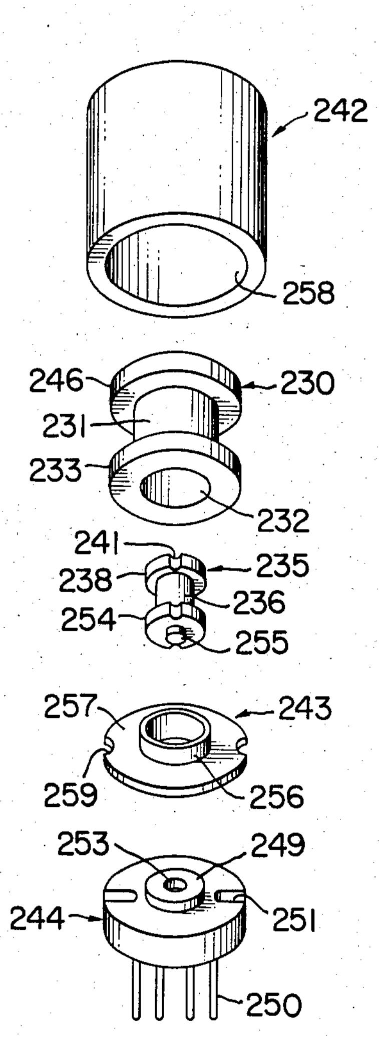
FIG. 18 is an exploded perspective view illustrating a further additional embodiment of the invention.

Referring to FIGS. 18 and 19, there is shown a further additional embodiment of a variable inductor according to the present invention.

FIG. 18 is an explanatory view shown in cross section and FIG. 19 is an exploded perspective view in which an indication of windings is omitted.

As shown in FIGS. 18 and 19, the variable inductor of this embodiment comprises drum-shaped first and second cores 230 and 235, a pot-shaped third core 242, a spacer 243, and a base member 244, wherein the first, second and third cores 230, 235 and 242 are all made of magnetic material of ferrite, and the spacer and the base member 244 are made of synthetic resin.

The first core 230 is provided at both axial ends with circular flanges and a winding portion 231 having a hollow portion 232 which is circular in lateral cross section and opened at the lower flange 233 wherein a control coil 234 is wound on the winding portion 231.

The second core 235 is provided at both axial ends with circular flanges and a winding portion 236 on which a tuning coil 237 is wound. The second core 235 thus formed is inserted into the hollow portion 232 of the first core 230 so that the winding portion 236 is in parallel with the winding portion 231 of the first core 230. The upper flange 238 is formed with a projection 239 in the center thereof and the projection 239 is adapted to be in contact in a bottom surface 240 of the hollow portion 232. In general, it is not easy to make the narrow bottom surface flat. Accordingly, there is a possibility that the peripheral edge of the upper flange 238 bumps against the bottom surface 240, resulting in breakage thereof. However, this can be prevented by the presence of the projection 239. The second core 235 is further provided at both flanges with grooves 241 for leading a lead wire for the tuning coil 237.

The first core 230 is inserted into the third core 242 in a manner that the winding portion 231 is perpendicular to a bottom surface 245. The first core 230 is further provided on the upper flange 246 with a projection 247 adapted to be fitted into a recess formed in the bottom surface 245. This facilitates the positioning of the first core 230 in a horizontal direction.

The disk-shaped base member 244 is provided on its upper central portion with a smaller disk-shaped projection 249 having a bore 253 into which a projection 255 formed on the lower flange 254 of the second core 235 is fitted. The base member 244 is provided at the lower surface with a plurality of terminal pins 250 which connect lead wires for the control coil 234 and the tuning coil 237. The base member 244 is further provided with grooves 251 for passing lead wires therethrough and a projection 252 for preventing each root portion of the terminal pins 250 from being in contact with a printed-circuit board when the base member is mounted thereon.

The spacer 243 is formed with e.g. a polyester film, and comprises a cylindrical portion 256 provided in the central thereof and a circular flange portion 257 located below the cylindrical portion 256. The spacer 243 is arranged on the base member 244 so as to surround the projection 249. The cylindrical portion 256 is interposed between the lower flange 254 and the inner peripheral surface of the body of the first core 230 in which the hollow portion 232 is formed, and the flange portion 257 is positioned below the lower flange 233 of the first core 230. The peripheral edge of the flange portion 257 is adapted to be in contact with the inner peripheral surface 258 of the third core 242 fitted over the base member 244. The flange portion 257 is provided with cut portions 259 for passing lead wires therethrough. Reference numerals 248 and 260 denote magnetic paths for the control coil 234 and for the tuning coil 237, respectively.

Figure 20:
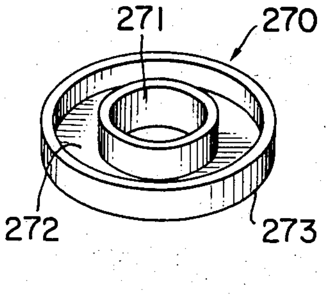
FIG. 20 is a perspective view illustrating another embodiment of a spacer employed in the present invention.

FIG. 20 is a perspective view illustrating another embodiment of the spacer.

A spacer 270 shown in this figure comprises a central cylindrical portion 271, a flange portion 272 below the cylindrical portion 271, and a turnover portion 273 formed by upwardly bending the peripheral edge of the flange portion 272. An explanation will be made in the case where the spacer 270 is applied to the structure shown in FIG. 9. The spacer 270 is located between the lower flange 233 of the first core 230 and the lower flange 254 of the second core 235 in a manner similar to the spacer 243. In this instance, the turnover portion 273 is positioned between the inner peripheral surface 258 of the third core 242 and the lower flange 233 of the first core 230. Axially extending portions of the spacer for preventing contact between cores may be positioned between the first and second cores 230 and 235 and/or between the third core 242 and the first core 230 according to need. The arrangement of the spacer 270 has a relation to an improvement in the engagement accuracy of other means for preventing contact, e.g., the accuracy of the engagement between the projection 255 of the second core 235 and the bore 253 of the base member 244 and the accuracy of the engagement between the projection 247 of the first core and the recess of the bottom surface 245 of the third core 242. Whether the outer peripheral surface of the spacer 243 should be in contact with the inner peripheral surface 258 of the third core 242 may be determined in the same manner. In addition, when the cylindrical portion is formed by punching a flat sheet, the resultant cylindrical portion partially includes parts spaced to each other. However, even in such a case, it is sufficient that the cylindrical portions are uniformly and circumferentially arranged. Further, the provision of the spacer between the lower flange 233 of the first core 230 and the inner peripheral surface 258 of the third core 242 is advantageous in preventing a resin from intruding into the inside of the inductor through the gap between the third core 242 and the base member 244 when the surface below the base member 244 is sealed with the resin.

The current controlled variable inductor of the invention taught by the embodiment shown in FIGS. 18 and 19 is characterized in that the spacer for preventing contact of each core is arranged in the vicinity of the opening of the first core. Thus, even if there are slight variations in the relative arrangement of the first, second and third cores, no contact is produced by interposing the axially extending portions of the spacer or radially extending portion such as the flange portion therebetween. Further, a space having a fixed width can be securely provided in the middle of magnetic paths for the control coil and the tuning coil. Thus, the width of a space between the inner peripheral surface of the lower flange 233 of the first core 230 and the outer peripheral surface of the lower flange 254 of the second core 235 may be precisely determined, thereby making it possible to reduce the variations particularly in the maximum value of inductance. Further, the width of a clearance between the inner peripheral surface 258 of the third core 242 and the outer peripheral surface of the lower frange 233 of the first core 230 may be precisely determined, thereby making it possible to reduce the variations in values expressed by variable ratio of inductance, i.e. the ratio of the maximum value to the minimum value.

Figure 1:
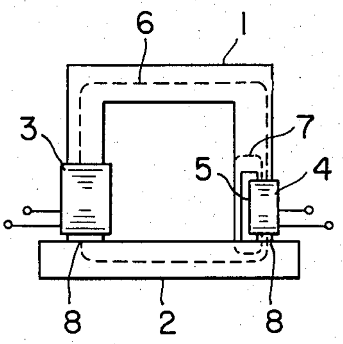
FIG. 1 PRIOR ART
FIG. 1 is a side view illustrating a prior art current controlled variable inductor.

As described above, the current controlled variable inductor according to the present invention comprises first and second cores, on which tuning and control coils are respectively wound, arranged so that one is located inside or outside of the other, and a third coil arranged outside of both the cores. A magnetic path formed by the control coil or the tuning coil is not completely closed magnetic path, but has a space in the route thereof. The width of the space is precisely set by the arrangement of a spacer. The contact of the first and second cores is kept uniform by separately supporting them or by resiliently supporting either of them. According to the present invention, the structure having a space in the route of a magnetic path and the abovementioned various devices effectively applied thereto can reduce variations in characteristics as compared to the prior art variable inductor featured by contacting a plurality of cores with each other to form a closed magnetic path as shown in FIG. 1. It is needless to say that a mirror finish on the contact portions is not required. A coil can be directly wound on a core by making use of winding technology for high frequency coil, resulting in easiness of assembly. Thus, the present invention can provide a current controlled inductor quite advantageous in practical use.

What is claimed is:

1. A current controlled variable inductor comprising:

(a) a first core provided with a winding portion having a hollow portion inwardly thereof;

(b) a second core adapted to be inserted into said hollow portion of the first core, said second core having a winding portion arranged in parallel with said winding portion of said first core in the inserted condition thereof;

(c) a third core which is pot-shaped and accommodates said first core so that said winding portion of said first core is perpendicular to a bottom surface of said third core, and (d) a control coil wound on a said winding portion of one of said first core and said second core, a tuning coil wound on a said winding portion of the other one of said first core and said second core, both said control coil and said tuning coil being arranged such that a magnetic path produced by the coil wound on said first core extends mainly throughout the winding portion of said first, second and third cores, a magnetic path produced by the coil wound on said second core extends mainly throughout the winding portion of said first and second cores, and a magnetic flux density in said winding portion of said second core where both of said magnetic paths overlap is varied in response to a current flowing through thee control coil, whereby an effective permeability of said second core is controlled to produce changes in inductance of said tuning coil.

2. A current controlled variable inductor as set forth in claim 1, wherein said first and second cores are supported on a base member.

3. A current controlled variable inductor as set forth in claim 2, wherein said second core is inserted into said hollow portion of said first core, said first core being without a lower flange and being raised relative to said base member.

4. A current controlled variable inductor as set forth in claim 2, wherein said second core is inserted into a bottom surface of said hollow portion of said first core, said first core being raised relative to said base member.

5. A current controlled variable inductor as set forth in claim 1, wherein an opening portion of said hollow portion of said first core is provided at a lower flange of said first core, and said second core has a lower flange formed as double steps, said lower flange of said first core being mounted on the lower step of said lower flange.

6. A current controlled variable inductor as set forth in claim 1, wherein said hollow portion of said first core penetrates said first core.

7. A current controlled variable inductor as set forth in claim 1, wherein said hollow portion of said first core is clogged with a core of material different from that of said first core.

8. A current controlled variable inductor as set forth in claim 1, wherein said hollow portion of said first core penetrates said first core, and said second core extends substantially throughout the penetrated portion of said hollow portion.

9. A current controlled variable inductor as set forth in claim 1, wherein said hollow portion of said first core is penetrated, said second core extends substantially throughout the penetrated portion of said hollow portion, and said hollow portion of said first core and a lower flange of said second core are provided with tapered portions fitted to each other.

10. A current controlled variable inductor as set forth in claim 1, wherein said first and second cores are mounted on a common base member, one of said first and second cores being resilient supported on said base member.

11. A current controlled variable inductor as set forth in claim 1, wherein said first and second cores are supported on separate base members, respectively.

12. A current controlled variable inductor as set forth in claim 1, wherein said first and second cores are supported on an outer annular base member and on an inner disk-shaped base member which are coaxially arranged, respectively.

13. A current controlled variable inductor as set forth in claim 1. wherein an opening portion of a hollow portion of said first core is provided at an upper flange of said first core, said first core is supported on a base member, and said second core is resiliently supported on a bottom surface of said third core.

14. A current controlled variable inductor as set forth in claim 1, wherein a spacer for preventing at least one of contacts of said first and second cores and of said first and third cores is arranged in the vicinity of an opening of said hollow portion of said first core.

* * * * *